US007432699B2

(12) United States Patent
AF Klercker Alakula

(10) Patent No.: US 7,432,699 B2

(45) Date of Patent: Oct. 7, 2008

(54) TRANSFORMER WITH PROTECTION AGAINST DIRECT CURRENT MAGNETIZATION CAUSED BY ZERO SEQUENCE CURRENT

(75) Inventor: Mats AF Klercker Alakula, Käviinge (SE)

(73) Assignee: Forskarpatent I SYD AB, Lund (SE)

( * ) Notice: Subject to any disclaimer, the term of this patent is extended or adjusted under 35 U.S.C. 154(b) by 0 days.

(21) Appl. No.: 11/318,838

(22) Filed: Dec. 27, 2005

(65) Prior Publication Data

US 2006/0197511 A1 Sep. 7, 2006

Related U.S. Application Data

(63) Continuation of application No. PCT/SE2004/000974, filed on Jun. 17, 2004.

(30) Foreign Application Priority Data

Jun. 27, 2003 (SE) .................................... 0301893

(51) Int. Cl.
*G01R 15/18* (2006.01)

(52) U.S. Cl. .................................................. 324/117 R

(58) Field of Classification Search ........................ None
See application file for complete search history.

(56) References Cited

U.S. PATENT DOCUMENTS 2,917,714 A * 12/1959 Jensen ......................... 331/45
3,122,699 A * 2/1964 Schohan ..................... 323/232
3,215,961 A * 11/1965 Dortort ........................ 336/12
3,504,318 A * 3/1970 Hattrup et al. ................ 336/12
3,509,507 A * 4/1970 Specht ......................... 336/12
3,624,499 A * 11/1971 Smith et al. .................... 324/86
3,701,008 A * 10/1972 Kusters et al. .............. 324/726
4,130,790 A * 12/1978 Heisey ....................... 323/309
5,406,437 A 4/1995 Levin
5,557,249 A * 9/1996 Reynal ........................ 336/10
5,790,356 A 8/1998 Bottrell et al.
6,043,569 A * 3/2000 Ferguson .................... 307/105
6,078,172 A * 6/2000 Lenhard ................. 324/117 R (Continued)

FOREIGN PATENT DOCUMENTS

EP 0511417 11/1992

(Continued)

OTHER PUBLICATIONS

"Study and discussion of methods for mitigating and eliminating geomagnetically induced current (GIC)"; Xiangdang et al.,; Automation of Electric Power Systems; China; 2000, vol. 24, No. 7; pp. 58-60.

(Continued)

*Primary Examiner*—Jermele M Hollington
(74) *Attorney, Agent, or Firm*—Gauthier & Connors LLP

(57) ABSTRACT

The present invention relates to a transformer being protected against direct current induced by geomagnetic flux changes, so called zero sequence current, whereby it comprises at least one compensation winding for direct current on the transformer core to compensate for undesired magnetization, by adding a current opposite to the direction of the magnetization caused by the zero sequence current carried by the alternating current to be transformed to reduce high magnetization saturation levels.

12 Claims, 3 Drawing Sheets

U.S. PATENT DOCUMENTS

| | | | | |
|---|---|---|---|---|
| 6,466,466 | B1 * | 10/2002 | Karlsson et al. | 363/44 |
| 7,170,268 | B2 * | 1/2007 | Kim | 323/272 |
| 2007/0217103 | A1 * | 9/2007 | AF Kiercker Alakula et al. | 361/58 |

FOREIGN PATENT DOCUMENTS

| | | |
|---|---|---|
| SU | 1631658 | 2/1991 |
| WO | WO2005022716 | 3/2005 |

OTHER PUBLICATIONS

"Transformer Design Considerations for Mitigating Geomagnetic Induced Saturation"; Viana et al.; IEEE Transactions on Magnetics, vol. 35, No. 5; Sep. 1999; pp. 3532-3534.

* cited by examiner

TRANSFORMER WITH PROTECTION AGAINST DIRECT CURRENT MAGNETIZATION CAUSED BY ZERO SEQUENCE CURRENT

This application is a continuation of PCT/SE04/00974 filed Jun. 17, 2004.

TECHNICAL FIELD

The present invention relates to a transformer with protection against direct current magnetization caused by zero sequence current, in a power generation, transmission or distribution system with a rated power ranging from a few kVA up to more than 1000 MVA and with a rated voltage ranging from 3-4 kV and up to very high transmission voltages, 400 kV to 800 kV or higher.

BACKGROUND OF THE INVENTION

The primary task of a power transformer is to act as an electric "gear box" and sometimes to create a galvanic isolation, allowing electric energy to flow from one electrical system to another. The electrical systems interconnected with a transformer usually have different voltages but always the same frequency. The power transformer, in its simplest form, comprises generally at least two windings, a primary winding and a secondary winding. The transformation ratio is defined by the winding turns in the primary and secondary winding and the connection of the windings, e.g., In "delta" or "Y"-connection.

In the transferring of large powers at high voltages over large distances, the geomagnetic field at changes thereof imposes an often quite large quasi-direct current, (DC) in the power line(-s), so called zero sequence current, which direct current accompanies the alternating current phase (AC-phase). The phase lines can be regarded as one line over long distances as the distance between each line becomes relatively small, which causes the induction of the DC current, the zero sequence current, to be equal in all phases, when the geomagnetic field is subjected to changes.

The direct current gives rise to unilateral magnetization levels of any transformer in the system, which may cause the core of the transformer to enter magnetic saturation. This leads to the transformer consuming high magnetizing currents, thus being disconnected, normally by means of a protecting system, which releases the transformer from the system. When a transformer is disconnected, released, from the system, this will of course lead to disturbances In the transmission and distribution of electrical energy.

SUMMARY OF THE INVENTION

It has turned out possible to introduce a passive compensation system of direct current, zero sequence current, induced by geomagnetic field changes in transformers eliminating high magnetization saturation levels, which is characterized in that a first impedance (Z1) is arranged from the neutral point to ground in parallel to the compensation winding, which Impedance provides a high impedance for low or zero frequencies, and any preferably, a low impedance for higher frequencies.

In one preferred embodiment of the invention the compensation windings are further connected to earth via a second impedance (Z2) being able to short circuit any DC voltage, and having any impedance for all other frequencies.

In a further preferred embodiment of the invention the first impedance is tuned for $3^{rd}$ tone series or higher.

In one preferred embodiment the transformer is selected from the group of 1-phase or 3-phase transformers.

In another preferred embodiment the transformer is selected from the group of two-legged, three-legged, four-legged and five-legged transformers.

In further preferred embodiment the four and five-legged transformers comprises at least one magnetic return conductor leg, as well as three phase legs.

In another further preferred embodiment a compensation winding is applied to each phase-leg, which compensation windings are substantially Identical with regard to magnetizing ability.

In one preferred embodiment a compensation winding is applied to any magnetic return conductor leg present, whereby any two such compensation windings are substantially identical with regard to magnetizing ability.

In another preferred embodiment a counteracting current is arranged to be driven through the compensation winding(-s).

In further preferred embodiment the operation of the counteracting direct current Is made power electronically.

In further preferred embodiment the compensation winding(-s) is/are connected to ground.

In another further preferred embodiment the compensation winding(-s) is/are wound in the opposite direction of the winding carrying the current to be compensated for.

DETAILED DESCRIPTION OF THE INVENTION

Figure 1:
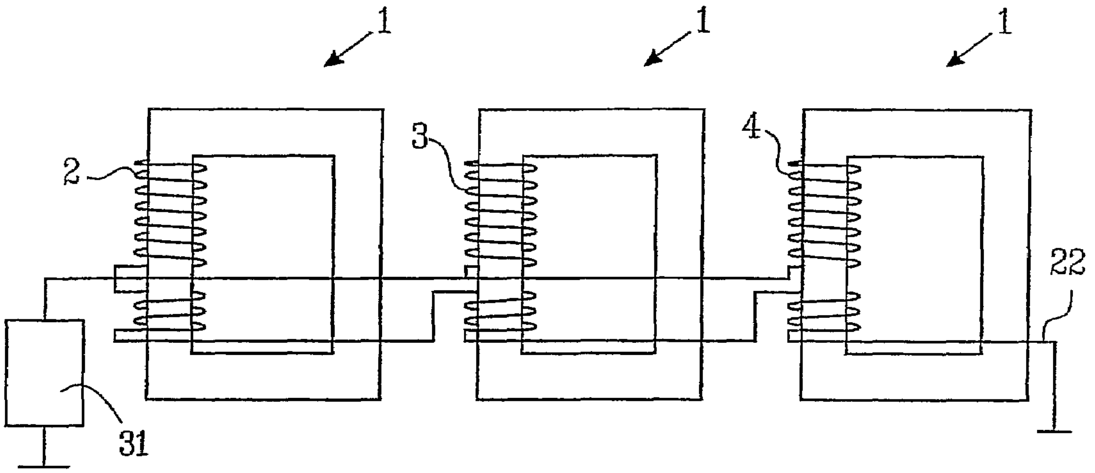
FIG. 1 is a schematic figure of a first embodiment of the invention used on three single phase transformers, using passive compensation.

A first embodiment of the invention shows (FIG. 2) a three-phase transformer 1 comprising three phase windings 2, 3, 4 one for each phase on each their leg, whereby the phase windings are separated in a primary winding and a secondary winding on each leg. The construction of primary versus secondary winding does not matter with the regard to the present invention, and these have been separated one over the other in the drawings, whereby alternatives are the one outside the other depending on the parameters to be chosen for the specific use of the transformer. Three compensation windings 5, 6, 7 connected in series (one for each phase leg) are present on the transformer 1, whereby the transformer has no magnetic return conductor. The compensation windings 5, 6, 7 are all, preferably wound in a direction opposite the ones of the main phase windings 2, 3, 4, however, the direction of their winding turns, in this embodiment is not critical due to the control of this transformer embodiment.

Figure 3A:
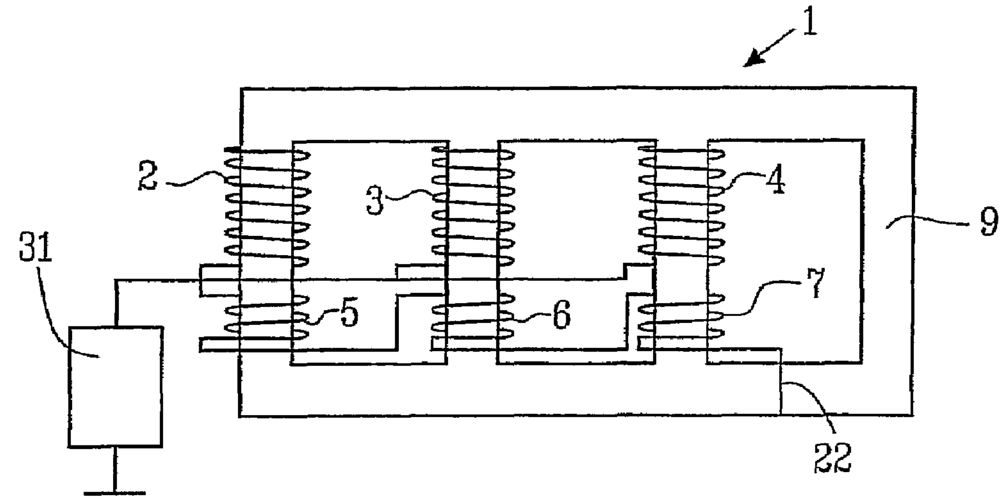
FIG. 3 is a schematic figure of a third embodiment of the invention used on four legged transformer A) with compensation windings on each phase leg, and B) with one compensation winding on the magnetic return conductor, using passive compensation.
Figure 3B:
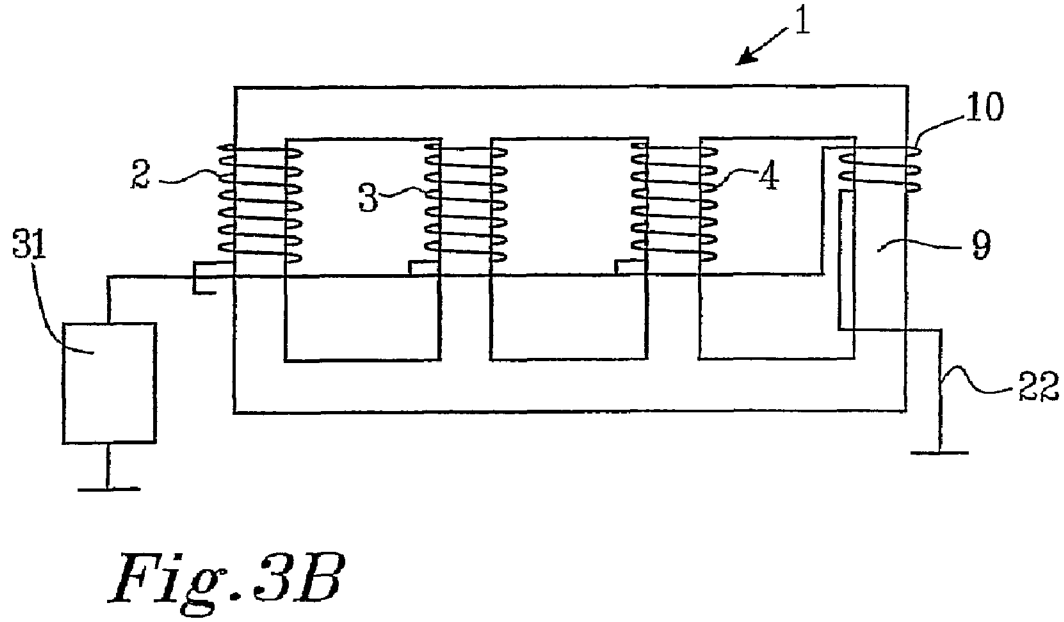

FIG. 3 shows a second embodiment wherein a fourth leg 9 is present. This type of transformer is a transformer with magnetic return conductor. In this embodiment a counteracting compensation winding 10 is applied around the fourth leg FIG. 3B. The compensation winding 10 is wound in a direction opposite to the phase windings 2, 3, 4. In the description there is thus a question of transformer legs having different purposes.

Within the context of the present application a phase leg is a leg carrying a primary and/or secondary phase winding, and a return leg is a leg functioning as a magnetic return conductor being free from any phase winding.

Figure 2:
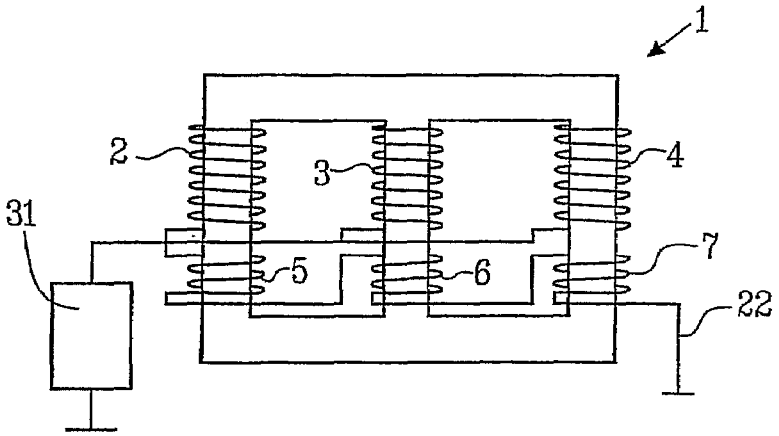
FIG. 2 shows a schematic figure of a second embodiment of the invention used on a three legged transformer, using passive compensation.

The compensation winding arrangement of FIG. 2 can also be applied to a 4-legged transformer, i.e., a part winding is arranged to each of the legs carrying the AC-phase windings (FIG. 3).

FIG. 1 shows a 1-phase transformer, which can be used as such dividing off an ingoing phase line, or can be used in series with two identical transformers each handling their ingoing phase. In the 1-phase transformer, a compensation winding 5 is wound around the magnetic return conductor, or depending on the design of the transformer is split between the different legs. An 1-phase transformer can be said being a two-legged transformer, where the primary winding may be present around one leg and the secondary winding around the other leg, or the primary winding is split into two, each part being placed around each leg, and carrying the secondary windings, within or around the primary ones.

Figure 4A:
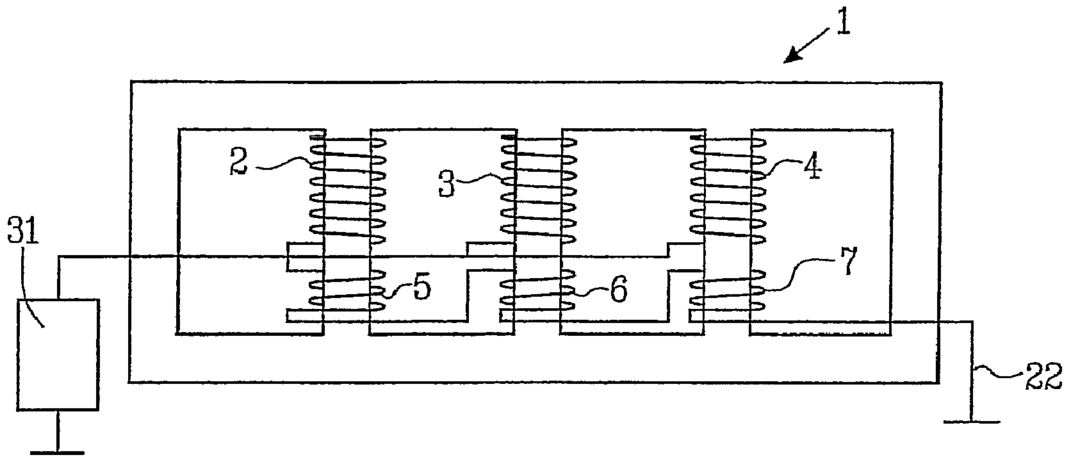
FIG. 4 shows a schematic figure of a fourth embodiment of the invention used on a five legged transformer A) with compensation windings on each phase leg, and B) with one compensation winding on the magnetic return conductor, using passive compensation.
Figure 4B:
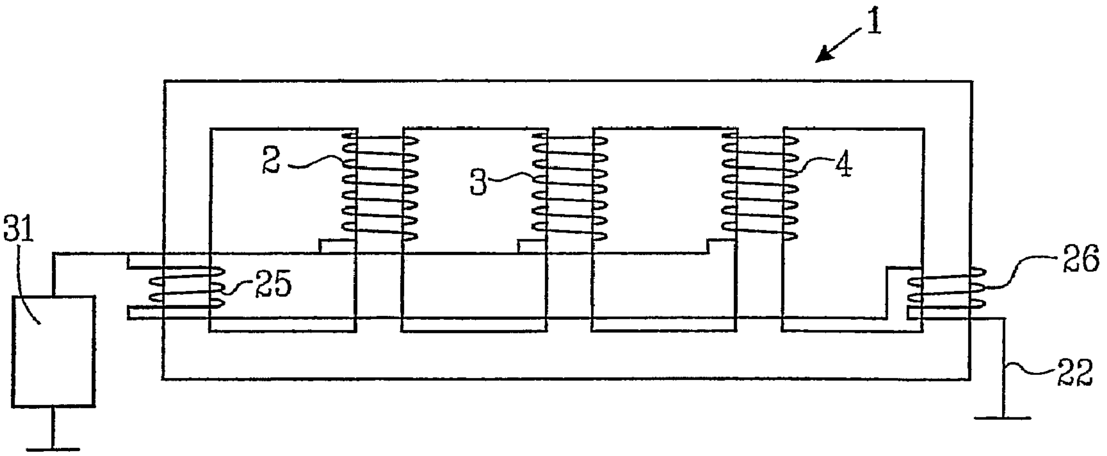

FIG. 4 shows a third embodiment of a transformer having five legs, where compensation windings 25, 26 have been applied around the two non-phase legs, FIG. 4B. The number of turns of the compensation windings is preferably the same to simplify control of the operation of the compensation current from the DC source.

The compensation winding arrangement of FIG. 3 can also be applied to a 5-legged transformer, i.e., a part winding is arranged to each of the legs carrying the AC-phase windings FIG. 4A.

FIG. 2 shows an embodiment with three-legged transformer 1 having its transformer windings 2, 3, 4, which is provided with a middle point. The middle point 22 is connected to ground via a compensation winding 5, 6, 7 applied on each leg. In this case the transformer compensates itself. There might be an impact on the impedance on other zero sequence current components, which impedance may change at compensation. This problem is substantially eliminated or at least reduced to a major extent by having an impedance (Z1) 31 connected to ground in parallel to the compensation windings 5, 6, 7, preferably tuned for the 3$^{rd}$ tone series or higher. The impedance Z1 shall have a high. impedance at less than 10 Hz, but provide any Impedance for all other frequencies.

In a preferred embodiment a further impedance (Z2) 32 Is applied between the compensation windings and earth at 22, which impedance will be low or zero at less than <1 Hz and will provide any impedance for all other frequencies.

FIG. 3 shows a further embodiment showing a four-legged transformer with its windings 2, 3, 4 having its middle point 22, whereby a compensation winding 20 is applied to the fourth leg 9. The middle point 22 Is connected in series to the compensation winding 10, which in turn is connected to ground. In series herewith a series resonance link 31 is arranged, which link 31 is tuned in 3$^{rd}$ tone or higher, such as the 9$^{th}$ tone. The compensation winding arrangement of FIG. 3A can also be applied to a 4-legged transformer of FIG. 4A.

A five-legged transformer can be construed for self-compensation in the same way as the four-legged one, whereby the compensation winding 10 has to be distributed to both the fourth and the fifth legs, as in the embodiment of FIG. 4.

If it is supposed that the magnetizing current is only some percentage of the rated current and that the resistive losses at rated current are some percentage of the rated power a winding of the same size as the phase winding request a resistive loss in the order of $10^{-5}$ to $10^{-4}$ times the rated power, if it should only transfer a current of the same order as the magnetization current. This means that reasonable powers are involved even if a compensation winding is made substantially smaller than the real phase winding.

The invention claimed is:

1. A transformer being protected against direct current magnetization induced by geomagnetic field changes, so called zero sequence current, comprising at least one compensation winding on a transformer core to compensate for undesired magnetization, by adding a current opposite to the direction of the magnetization caused by low frequency zero sequence current carried by the alternating current to be transformed to reduce high magnetization saturation levels, and wherein a middle point of a primary winding is connected to ground via the actual compensation winding(-s), whereby the transformer becomes self-compensating, wherein a first impedance is arranged from the neutral point to ground in parallel to the compensation winding, which impedance provides a high impedance for low or zero frequencies, and any preferably, a low impedance for higher frequencies.

2. A transformer according to claim 1, wherein the at least one compensation winding is further connected to earth via a second impedance being able to short circuit any DC voltage, and having any impedance for all other frequencies.

3. A transformer according to claim 1, wherein the first impedance is limed for 3$^{rd}$ tone series or higher.

4. A transformer according to claim 1, wherein the transformer is selected form the group of 1-phase or 3-phase transformers.

5. A transformer according to claim 1, wherein the transformer is selected from the group of two-legged, three-legged, four-legged and five-legged transformers.

6. A transformer according to claim 4, wherein the four and five-legged transformers comprises at least one magnetic return conductor 1*e*, as well as three phase legs.

7. A transformer according to claim 1, wherein a compensation winding is applied to each phase-leg, which compensation windings are substantially identical with regard to magnetizing ability.

8. A transformer according to claim 1, wherein a compensation winding is applied to any magnetic return conductor leg present, whereby any two such compensation windings are substantially identical with regard to magnetizing ability.

9. A transformer according to claim 1, wherein a counteracting current is arranged to be driven through the compensation winding (-s).

10. A transformer according to claim 8, wherein the operation of the counteracting current is made power electronically.

11. A transformer according to claim 1, wherein the compensation winding(-s) is/are connected to ground.

12. A transformer according to claim 1, wherein the compensation winding(-s) is/are wound in the opposite direction of the winding carrying the current to be compensated for.

* * * * *